United States Patent
Eichler et al.

(10) Patent No.: US 8,565,278 B2
(45) Date of Patent: Oct. 22, 2013

(54) SEMICONDUCTOR COMPONENT AND METHOD FOR PRODUCING A SEMICONDUCTOR COMPONENT

(75) Inventors: Christoph Eichler, Tegernheim (DE); Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 17 days.

(21) Appl. No.: 12/863,673

(22) PCT Filed: Mar. 9, 2009

(86) PCT No.: PCT/DE2009/000334
§ 371 (c)(1),
(2), (4) Date: Sep. 2, 2010

(87) PCT Pub. No.: WO2009/121315
PCT Pub. Date: Oct. 8, 2009

(65) Prior Publication Data
US 2011/0007767 A1    Jan. 13, 2011

(30) Foreign Application Priority Data

Mar. 31, 2008 (DE) .......................... 10 2008 016 489
Apr. 30, 2008 (DE) .......................... 10 2008 021 674

(51) Int. Cl.
*H01S 5/00* (2006.01)

(52) U.S. Cl.
USPC .......................... 372/45.01; 372/43.01; 438/5

(58) Field of Classification Search
USPC ...................................................... 372/45.01
See application file for complete search history.

(56) References Cited

U.S. PATENT DOCUMENTS

| | | | |
|---|---|---|---|
| 5,023,880 A | 6/1991 | Suzuki et al. | |
| 6,132,632 A * | 10/2000 | Haney et al. | 216/70 |
| 6,215,803 B1 * | 4/2001 | Hata | 372/46.01 |
| 6,266,354 B1 | 7/2001 | Chino et al. | |
| 6,542,528 B1 | 4/2003 | Sato et al. | |
| 6,680,957 B1 | 1/2004 | Koike et al. | |
| 7,566,579 B2 | 7/2009 | Watson et al. | |
| 2002/0094002 A1 * | 7/2002 | Amano et al. | 372/45 |
| 2002/0141469 A1 * | 10/2002 | Yamasaki et al. | 372/46 |
| 2005/0032344 A1 | 2/2005 | Hatano et al. | |
| 2006/0203871 A1 * | 9/2006 | Ueda et al. | 372/43.01 |
| 2006/0267043 A1 | 11/2006 | Emerson et al. | |
| 2007/0030869 A1 | 2/2007 | Horie | |
| 2007/0268948 A1 * | 11/2007 | Freund | 372/46.01 |
| 2008/0056321 A1 | 3/2008 | Motomura et al. | |

FOREIGN PATENT DOCUMENTS

| | | |
|---|---|---|
| CN | 1452285 A | 10/2003 |
| CN | 1290055 C | 12/2006 |
| JP | 10-326940 A | 12/1998 |
| JP | 2000232094 A | 8/2000 |

(Continued)

*Primary Examiner* — Xinning Niu
(74) *Attorney, Agent, or Firm* — Slater & Matsil, L.L.P.

(57) ABSTRACT

A semiconductor component includes a semiconductor body with a semiconductor layer sequence having an active region, provided for generating coherent radiation, and an indicator layer. With respect to an interface which delimits the semiconductor body in regions in a vertical direction, on that side of said interface which is remote from the active region, the semiconductor body has a web-like region extending in a vertical direction between the interface and a surface of the semiconductor body. The indicator layer has a material composition that differs from that of the material of the web-like region which adjoins the indicator layer. A distance between the indicator layer and the surface is at most of the same magnitude as a distance between the interface and the surface.

11 Claims, 5 Drawing Sheets

(56) References Cited

FOREIGN PATENT DOCUMENTS

| JP | 2003229412 A | 8/2003 |
|---|---|---|
| JP | 2004-179532 A | 6/2004 |
| JP | 2006-093682 A | 4/2006 |
| JP | 2006-165421 A | 6/2006 |
| JP | 2006-222373 A | 8/2006 |
| JP | 2006-279079 A | 10/2006 |
| WO | WO 2006/051272 A1 | 5/2006 |

* cited by examiner

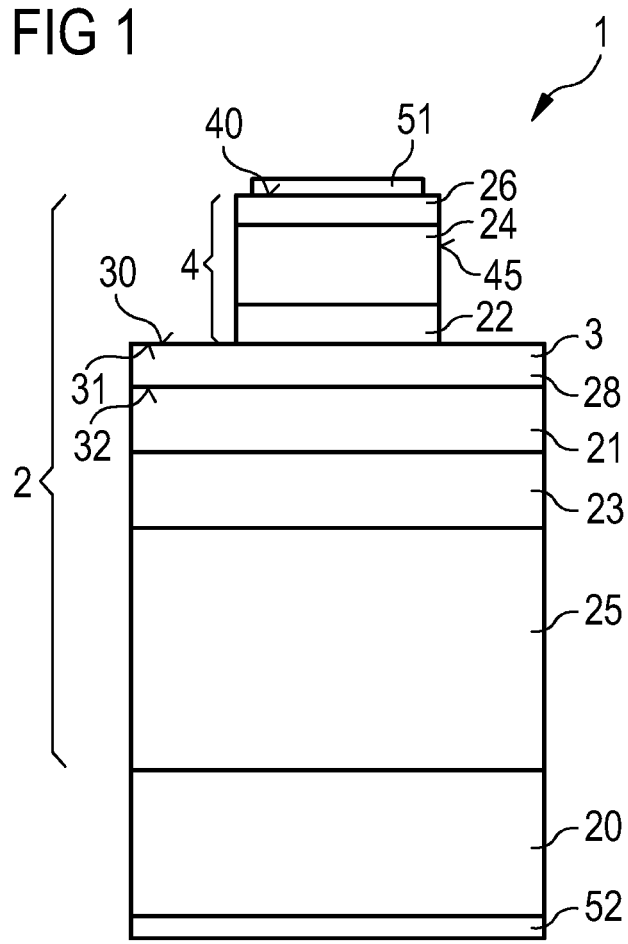

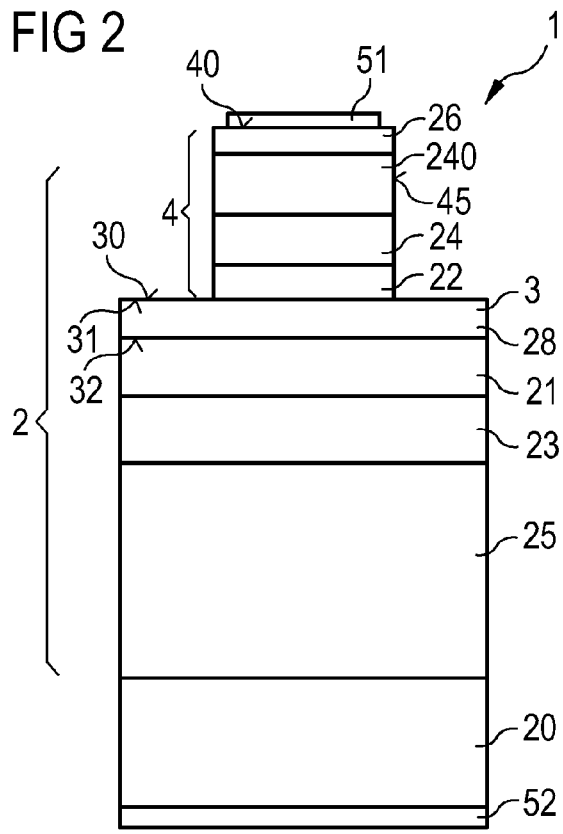
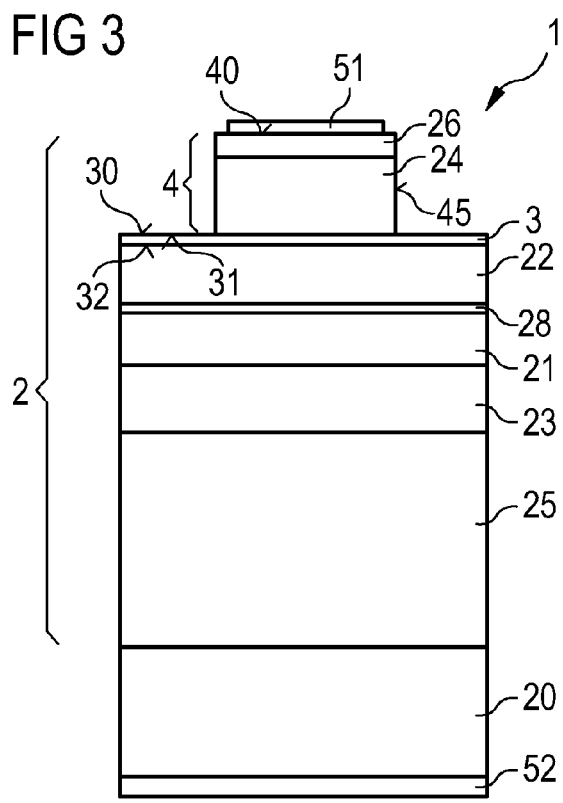

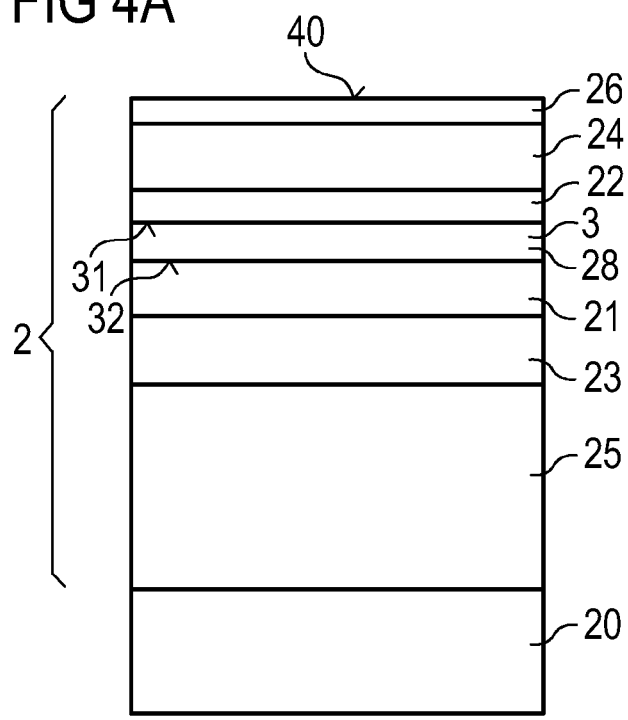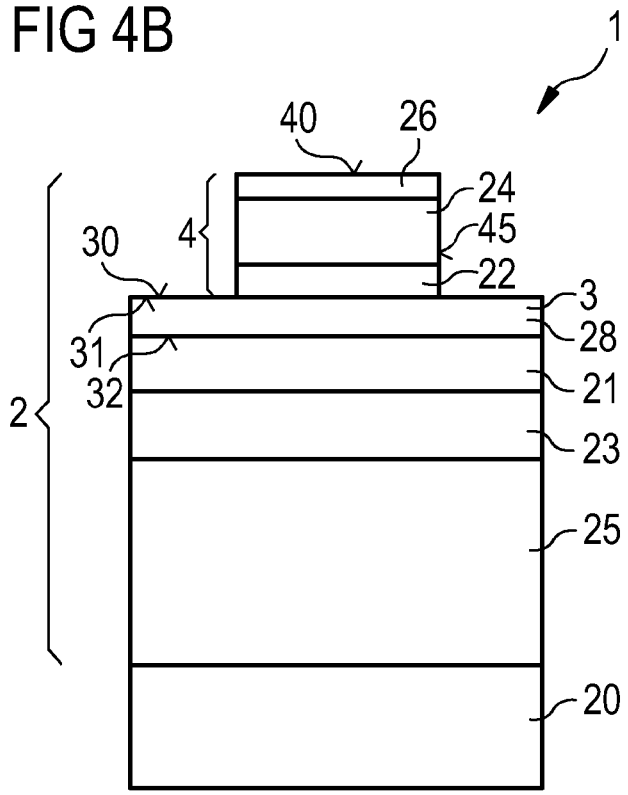

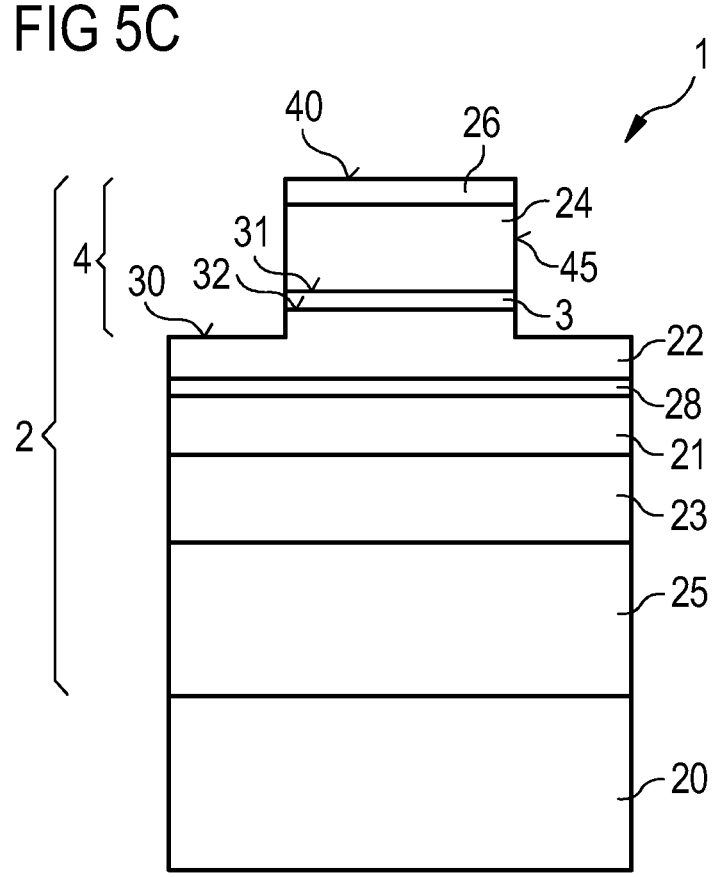

SEMICONDUCTOR COMPONENT AND METHOD FOR PRODUCING A SEMICONDUCTOR COMPONENT

This patent application is a national phase filing under section 371 of PCT/DE2009/000334, filed Mar. 9, 2009, which claims the priority of German patent application 10 2008 016 489.5, filed Mar. 31, 2008 and 10 2008 021 674.7, filed Apr. 30, 2008, each of which is incorporated herein by reference in its entirety.

TECHNICAL FIELD

The present application relates to a semiconductor component and to a method for producing a semiconductor component.

BACKGROUND

Edge emitting semiconductor laser diodes with ridge waveguide geometry (ridge waveguide laser diodes) typically have a web-type region provided, in particular, for wave guiding in a lateral direction. In order to produce the web-type region, semiconductor material may be removed in regions by means of an etching method, wherein the etching depth may be set by way of the duration of the etching process. In this case, inhomogeneities of the material composition and of the thickness of the semiconductor material which occur in a lateral direction, for instance on account of fluctuations in the production process, make it more difficult to effect uniform and reproducible formation of a web-type region with a predetermined height. This may lead to fluctuations in operating characteristic variables for the semiconductor lasers, for instance in the laser threshold, the gradient of the power-current characteristic curve and the mode behavior.

SUMMARY

One aspect of the invention specifies a semiconductor component that has improved optoelectronic properties and may be produced in a simplified manner. Furthermore, a method is specified with which a semiconductor component may be reliably produced in a simple manner.

A semiconductor component comprises, in accordance with one exemplary embodiment, a semiconductor body with a semiconductor layer sequence having an active region, provided for generating coherent radiation, and an indicator layer. The semiconductor body has an interface which delimits the semiconductor body in regions in a vertical direction. On that side of the interface which is remote from the active region, the semiconductor body has a web-like region extending in a vertical direction between the interface and a surface of the semiconductor body. The indicator layer has a material composition that differs from that of the material of the web-like region which adjoins the indicator layer. A distance between the indicator layer and the surface is at most of the same magnitude as a distance between the interface and the surface.

The distance between the indicator layer and the active region may be set as early as during the preferably epitaxial deposition of the semiconductor layer sequence of the semiconductor body. The web-like region may be formed in a particularly reproducible manner, in particular with regard to its extent in a vertical direction and/or its distance from the active region, wherein the vertical extent of the web-like region is at least of the same magnitude as the distance between the indicator layer and the surface.

In one configuration variant, the interface is formed by means of the indicator layer. In this case, the distance between the indicator layer and the surface may correspond or at least be close to the distance between the interface and the indicator layer. By way of example, the distance between a top side of the indicator layer which is remote from the active region and the interface may be at most 100 nm, preferably at most 50 nm.

In particular, the top side of the indicator layer may form the interface. The top side may furthermore be embodied as a planar or substantially planar area which separates the web-like region from the indicator layer. Consequently, the distance between the interface and the active region is substantially predetermined by the distance between the top side of the indicator layer and the active region as early as during the deposition of the semiconductor body.

In a further configuration variant, a distance between the indicator layer and the interface is at most 70 nm. In other words, a distance between an underside of the indicator layer which faces the active region and the active region is at most 70 nm greater than a distance between the interface and the active region. In this case, the indicator layer may be arranged completely within the web-like region.

A web-like region is understood to mean, in particular, a region which has, in a lateral direction, a smaller extent than the active region. The active region therefore projects beyond the web-like region at least in regions in a lateral direction.

A lateral direction is considered to be a direction which runs in a main extension plane of the semiconductor layers of the semiconductor body and perpendicularly to a main propagation direction of the radiation which, during operation, is generated in the active region and is to be amplified, in particular.

A vertical direction is correspondingly understood to mean a direction which runs perpendicularly to the main extension plane of the semiconductor layers of the semiconductor body.

In one preferred configuration, the semiconductor body has a charge carrier barrier, which is formed on that side of the active region which faces the web-like region. A radiative recombination of charge carriers that are injected into the semiconductor body during the operation of the semiconductor component may thus be restricted to the active region in an improved manner. The threshold for the operating current at which the generation of coherent radiation commences may be lowered.

In one configuration variant, the charge carrier barrier is formed by means of the indicator layer. Therefore, in addition to the simplified formation of the web-like region, the indicator layer may serve to ensure that the recombination of charge carriers is effected efficiently within the active region.

In an alternative configuration variant, the indicator layer is spaced apart from the charge carrier barrier. In particular, the indicator layer may be at a greater distance from the active region than the charge carrier barrier. The indicator layer may therefore be formed on that side of the charge carrier barrier which is remote from the active region. Indicator layer and charge carrier barrier may thus be chosen independently of one another, for instance with regard to their material composition. Furthermore, the distance between the web-like region and the active region may thus be set largely independently of the position of the charge carrier barrier.

The charge carrier barrier preferably has a greater transmissivity for one charge type than for the other charge type. By way of example, the charge carrier barrier may be embodied as an electron barrier which allows holes to pass through unimpeded or at least largely unimpeded. An electron barrier is preferably arranged in a p-conducting region of the semiconductor layer sequence or adjoins a p-conducting region. In particular, an electron barrier itself may be doped in p-conducting fashion.

Correspondingly, a hole barrier is preferably arranged in an n-conducting region or adjoins an n-conducting region and is furthermore preferably doped in n-conducting fashion.

In one preferred configuration, a waveguide layer is formed on that side of the active region which faces the web-like region. The waveguide layer is provided, in particular, for guiding the radiation that is to be generated and/or amplified in the active region in a vertical direction.

The indicator layer may be arranged between the waveguide layer and the active region. In other words, the waveguide layer may be arranged on that side of the indicator layer which is remote from the active region. A distance between the waveguide layer and the active region may therefore be set in a simple manner by means of the indicator layer. Furthermore, in this case, the web-like region may extend into the waveguide layer.

The indicator layer may also be arranged on that side of the waveguide layer which is remote from the active region. In this case, the waveguide layer may be formed outside the web-like region.

Furthermore, the indicator layer may also be formed in the waveguide layer. In this case, therefore, material of the waveguide layer may be arranged on both sides of the indicator layer.

An indicator layer is understood to mean, in particular, a layer which brings about a significant change in at least one property of a process gas during a dry-chemical removal method with respect to a layer disposed upstream in the removal direction. By monitoring this property it may be determined during production, in a precise and reproducible manner, when the indicator layer is reached.

In one preferred configuration, the indicator layer contains a material having a higher resistance to a dry-chemical removal method than the material, in particular directly adjoining, on that side of the indicator layer which is remote from the active region. The formation of a web-like region which extends in a vertical direction up to a predetermined distance from the active region may thus be realized in a simplified manner.

The semiconductor body preferably contains a III-V compound semiconductor material. With III-V semiconductor materials, high internal quantum efficiencies may be achieved during the generation of radiation.

In particular, the semiconductor body may contain a nitridic compound semiconductor material.

A nitridic compound semiconductor material is understood to mean a material which comprises a nitride III/N compound semiconductor material, preferably $Al_xIn_yGa_{1-x-y}N$, where $0 \leq x \leq 1$, $0 \leq y \leq 1$ and $x+y \leq 1$ hold true, in particular where $x \neq 1$, $y \neq 1$, $x \neq 0$ and/or $y \neq 0$. In this case, this material need not necessarily have a mathematically exact composition according to the above formula. Rather, it may have one or more dopants and additional constituents which substantially do not change the characteristic physical properties of the $Al_xIn_yGa_{1-x-y}N$ material. For the sake of simplicity, however, the above formula only comprises the essential constituents of the crystal lattice (Al, Ga, In, N), even if these may be replaced in part by small amounts of further substances.

Nitridic compound semiconductor materials are particularly suitable for generating radiation in the ultraviolet through the blue to the green spectral range.

In one preferred configuration, the indicator layer has a composition which, with regard to a group III material, for instance aluminum, indium or gallium, differs by at least 10 percentage points, particularly preferably by at least 20 percentage points, from the composition of a semiconductor layer of the web-like region which adjoins the indicator layer. The greater the difference in the material composition, the greater the extent to which the removal rates for these semiconductor layers may deviate from one another during production.

In one preferred development, the indicator layer has a higher aluminum content than the semiconductor layer of the web-like region which adjoins the indicator layer. The aluminum content of the indicator layer is furthermore preferably at least 20%, particularly preferably at least 30%.

In a further preferred configuration, the indicator layer contains a nitridic compound semiconductor material and is particularly preferably lattice-matched relative to gallium nitride. The relative deviation of the lattice constant of the indicator layer from the lattice constant of gallium nitride is preferably at most 5%, particularly preferably at most 3%. In particular the stress of a semiconductor body with an active region based on a nitridic compound semiconductor material may thus be reduced.

In a further preferred configuration, a cladding layer is arranged at least on one side of the active region. The cladding layer preferably has a lower refractive index than the waveguide layer. Wave guiding of the radiation generated in the active region during the operation of the semiconductor component in the waveguide layer is thus simplified.

The cladding layer or at least one partial layer of the cladding layer furthermore preferably contains $Al_xIn_yGa_{1-x-y}N$ having an indium content different from zero.

The gallium content is furthermore preferably at most 10%, such that $1-x-y \leq 0.1$ holds true. The cladding layer or at least the partial layer of the cladding layer may furthermore be lattice-matched relative to gallium nitride.

In a further preferred configuration, a distance between the indicator layer and the active region is at most 400 nm, particularly preferably at most 300 nm. The distance may be reduced to a greater extent and be at most 150 nm, preferably at most 120 nm, most preferably at most 70 nm. The web-like region may thus be formed particularly close to the active region. In particular, an indicator layer arranged so close to the active region may be embodied as a charge carrier barrier.

In a further preferred configuration, a side area of the web-like region runs at an angle of at most 30° with respect to a perpendicular to the main extension plane of the semiconductor layers of the semiconductor body. In particular, the side area may run perpendicularly or substantially perpendicularly, for instance with a deviation from the perpendicular by at most 10°, to the main extension plane of the active region. Furthermore, the side area may run parallel to a main propagation direction of the radiation generated in the active region. In particular, the side area may run perpendicularly or substantially perpendicularly to a coupling-out area for the radiation.

In one preferred development, the semiconductor component is embodied as an edge emitting semiconductor laser component, in particular as a semiconductor laser component with ridge waveguide geometry.

In a method for producing a semiconductor component, in accordance with one embodiment, a semiconductor layer sequence having an active region, provided for generating radiation, and an indicator layer is provided. Material of the semiconductor layer sequence arranged on that side of the indicator layer that is remote from the active region is removed in regions by means of dry-chemical removal of the semiconductor layer sequence, wherein a property of a process gas is monitored during the removal and the reaching of the indicator layer is determined by means of the change in the property of the process gas.

In this context, the term process gas encompasses in a broad meaning non-ionized, partly ionized and ionized gas (plasma), which may furthermore contain removed semiconductor material.

Reactive ion etching (RIE) or chemical assisted ion beam etching (CAIBE) is suitable, by way of example, as a dry-chemical removal method.

In particular, during this method, semiconductor material removal which is more extensive in a vertical direction may be ended or at least greatly reduced as soon as the indicator layer is reached. The thickness of the semiconductor material remaining on the active region may therefore be set by way of the thickness and the distance of the indicator layer from the active region as early as during the deposition of the semiconductor layer sequence.

In other words, during the method described, a predetermined removal depth or a predetermined distance from the active region may be set largely independently of the actual removal rate.

In one preferred configuration, a change in the material composition of the removed semiconductor material is determined by means of the monitored property of the process gas.

The monitored property may be, in particular, the spectral emission characteristic of the process gas. Depending on the composition of the process gas, in this case the removed material may bring about, in at least one spectral range, an emission that is characteristic of the material. Preferably, the intensity of this emission is higher, the larger the amount of the material in the process gas.

In a further preferred configuration, the dry-chemical removal method and the indicator layer are coordinated with one another in such a way that material on the indicator layer is removed more slowly than material which is disposed directly upstream of the indicator layer as viewed in the removal direction. More widely, the dry-chemical removal method may be selective with respect to the material such that the removal method stops at the level of the indicator layer or is at least slowed down in such a way that no significant removal of the indicator layer takes place. The indicator layer may therefore fulfill the function of a stop layer for the removal method. The uncovering of the indicator layer in the predetermined regions may therefore be largely independent of the thickness of the material arranged on the indicator layer. Even in the case of an inhomogeneous layer thickness and/or an inhomogeneous material composition of the material arranged on the indicator layer in the main extension plane of the semiconductor layers, the indicator layer may thus be completely uncovered in the predetermined regions. A thickness of the semiconductor material that remains on the active region may therefore be made constant or at least largely constant in these regions.

In one preferred configuration, the indicator layer contains $Al_xIn_yGa_{1-x-y}N$ and furthermore preferably has a higher aluminum content than the material disposed directly upstream of the indicator layer as viewed in the removal direction.

The process gas furthermore preferably contains oxygen at least at times. As a result of oxygen being added to the process gas, the removal method may have a high selectivity with respect to the aluminum content of the semiconductor layers. In particular, the removal rate may be lower, the higher the aluminum content.

The semiconductor material may also be removed beyond the indicator layer. In particular, the method may be carried out in such a way that the removal method is initially stopped or at least slowed down upon reaching the indicator layer. Afterward, the method may be continued in modified fashion such that the indicator layer is removed in the uncovered regions. More extensively, material disposed downstream of the indicator layer as viewed in the removal direction may also be removed.

As a result of stopping or slowing down the removal at the indicator layer, material of the semiconductor layer sequence may initially be removed to a distance from the active region which is predetermined by way of the distance between the top side of the indicator layer and the active region as early as during the deposition of the semiconductor layer sequence. This removal to a predetermined distance from the active region may be effected independently of the actual removal rate and with a high homogeneity along the main extension plane of the semiconductor layers.

Afterward, the indicator layer and furthermore underlying semiconductor material may be removed in regions, such that material of the indicator layer only remains in the web-like region.

In particular, the dry-chemical removal method may be modified after the indicator layer has been reached, in such a way that material of the indicator layer is removed with an increased removal rate.

In one preferred configuration, the method is carried out for a plurality of semiconductor layer sequences, wherein the semiconductor layer sequences are respectively provided on separate carriers. The method may thus be carried out simultaneously for a plurality of semiconductor layer sequences, whereby the throughput during the production of the semiconductor components may be increased.

BRIEF DESCRIPTION OF THE DRAWINGS

The method described is particularly suitable for producing a semiconductor component described further above. Therefore, features described in connection with the method may also be employed for the semiconductor component, and vice versa.

Further features, advantageous configurations and expediences will become apparent from the following description of the exemplary embodiments in conjunction with the figures.

In the figures:

FIG. 1 shows a first exemplary embodiment of a semiconductor component in schematic sectional view;

FIG. 2 shows a second exemplary embodiment of a semiconductor component in schematic sectional view;

FIG. 3 shows a third exemplary embodiment of a semiconductor component in schematic sectional view;

FIGS. 4A and 4B show a first exemplary embodiment of a method for producing a semiconductor component on the basis of intermediate steps respectively illustrated in schematic sectional view; and FIGS. 5A to 5C show a second exemplary embodiment of a method for producing a semiconductor component on the basis of intermediate steps respectively illustrated in schematic sectional view.

Elements which are identical, of identical type or act identically are provided with identical reference symbols in the figures.

Figure 5A:
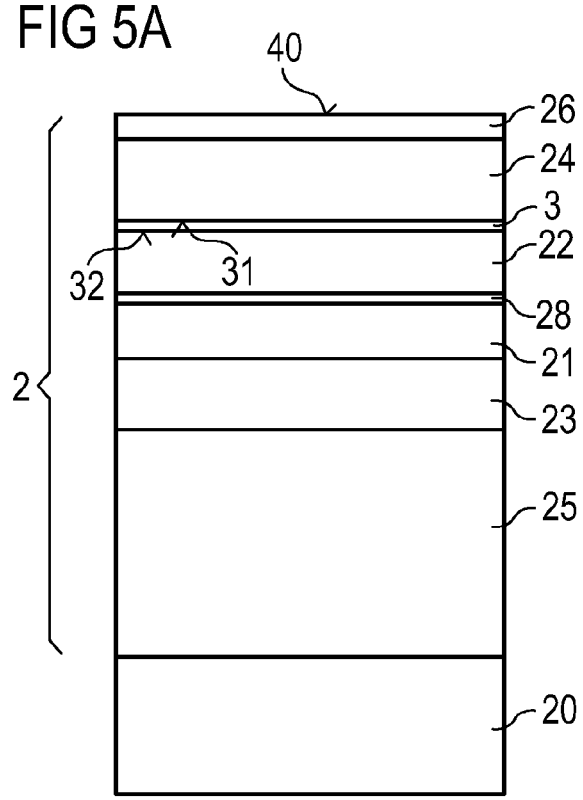

The figures are in each case schematic illustrations and therefore not necessarily true to scale. Rather, comparatively small elements and, in particular, layer thicknesses may be illustrated with an exaggerated size for clarification purposes.

DETAILED DESCRIPTION OF ILLUSTRATIVE EMBODIMENTS

A first exemplary embodiment of a semiconductor component 1 is shown in schematic sectional view in FIG. 1. The semiconductor component 1 is embodied as an edge emitting semiconductor laser with ridge waveguide geometry and has a semiconductor body 2 with a semiconductor layer sequence. The semiconductor layer sequence, which forms the semiconductor body, is preferably deposited epitaxially, for instance by means of MOVPE or MBE. The semiconductor body 2 is arranged on a carrier 20. The carrier 20 may be, for example, a growth substrate for the semiconductor layer sequence. As an alternative, the carrier 20 may also be different from the growth substrate for the semiconductor layer sequence.

The semiconductor layer sequence has an active region 21, provided for generating coherent laser radiation. Furthermore, the semiconductor layer sequence comprises an indicator layer 3. The semiconductor body 2 has an interface 30 which delimits the semiconductor body 2 in regions in a vertical direction. A web-like region 4 is formed on that side of the indicator layer 3 which is remote from the active region 21. The web-like region 4 extends in a vertical direction between a surface 40 of the semiconductor body 2 and the interface 30. The indicator layer 3 has a top side 31 remote from the active region 21 and an underside 32 facing the active region. The interface 30 is formed by means of the indicator layer 3.

In particular, the interface 30 may be at a distance of at most 100 nm, preferably at most 50 nm, from the top side 31 of the indicator layer 3. More extensively, the interface 30 may be formed by means of the top side 31 of the indicator layer 3, such that the distance between the indicator layer 3 and the surface 40 corresponds to the distance between the interface 30 and the surface 40.

The web-like region 4 therefore extends in a vertical direction as far as the indicator layer 3. A side area 45 of the web-like region 4 extends perpendicularly to a main extension plane of the semiconductor layers of the semiconductor body 2.

In a lateral direction, the web-like region 4 covers the interface 30 only in regions. Furthermore, in a lateral direction, the web-like region 4 has a smaller extent than the active region 21. The propagation of the mode of the radiation amplified in the active region 21 during operation in a lateral direction may thus be delimited.

Furthermore, the semiconductor layer sequence has a waveguide layer 22 and a further waveguide layer 23, in which the radiation that is generated and furthermore to be amplified in the active region 21 during operation propagates. A cladding layer 24 and a further cladding layer 25 are arranged on that side of the waveguide layer 22 which is remote from the active region 21 and, respectively, that side of the further waveguide layer 23 which is remote from the active region 21. The cladding layers 24, 25 expediently have a refractive index that is less than the refractive index of the respectively adjoining waveguide layers 22, 23.

The semiconductor body 2 has a connection layer 26 on that side of the cladding layer 24 which is remote from the active region 21. The connection layer 26 expediently has the same conduction type as the cladding layer arranged between the connection layer and the active region 21.

Furthermore, the semiconductor component 1 has a first contact 51 and a second contact 52, which are provided for externally making electrical contact with the semiconductor body 2. The contacts 51, 52 are electrically conductively connected to the semiconductor body 2 in such a way that, during the operation of the semiconductor component 1, via the contacts, charge carriers may be injected from two different sides into the active region 21 and may recombine there with emission of radiation.

In the exemplary embodiment shown, the charge carriers are injected from the first contact 51 via the connection layer 26 into the active region 21. In this case, the connection layer 26 forms the surface 40 of the web-like region 4. In a departure from this, the connection layer 26 may also be dispensed with. In this case, the first contact 51 may directly adjoin the cladding layer.

The contact layers 51, 52 preferably contain a metal, for instance gold, titanium, platinum, aluminum, silver, palladium, rhodium or nickel, or a metallic alloy comprising at least one of the metals mentioned.

The material composition of the semiconductor body 2 is described below by way of example for a semiconductor component provided for generating radiation in the ultraviolet and blue spectral range. The semiconductor layers of the semiconductor body 2 in each case contain the nitridic compound semiconductor material $Al_xIn_yGa_{1-x-y}N$. It goes without saying that the construction described is also suitable for a different semiconductor material, in particular a different III-V compound semiconductor material. For generating radiation having a higher wavelength, $Al_xIn_yGa_{1-x-y}P$ is suitable, in particular, for yellow to red radiation and $Al_xIn_yGa_{1-x-y}As$ is suitable for red to infrared radiation. In the case of the material compositions mentioned, $0 \leq x \leq 1$, $0 \leq y \leq 1$ and $x+y \leq 1$ respectively hold true, in particular where $x \neq 1$, $y \neq 1$, $x \neq 0$ and/or $y \neq 0$.

The indicator layer 3 contains a larger aluminum content than the waveguide layer 22 of the web-like region 4, the waveguide layer adjoining the indicator layer 3.

The aluminum content of the indicator layer 3 is preferably at least 30%, particularly preferably at least 50%. The material is furthermore preferably chosen in such a way that the indicator layer is lattice-matched with respect to GaN. By way of example, a layer having an aluminum content of 82% and an indium content of 18% has the same lattice constant as GaN.

By comparison with an $Al_xGa_{1-x}N$ semiconductor layer, the decrease in the lattice constant as the aluminum content increases may be completely or at least substantially compensated for in the case of an $Al_xIn_yGa_{1-x-y}N$ layer as a result of the addition of indium. The aluminum content may thus be increased without the stress increasing in this case relative to gallium nitride.

Furthermore, the band gap of $Al_xIn_yGa_{1-x-y}N$ increases as the aluminum content increases. Consequently, compared with the active region 21, the indicator layer 3 may have a high band gap and fulfill the function of a charge carrier barrier 28.

The semiconductor layers arranged on different sides of the active region 21 preferably have mutually opposite conduction types. By way of example, the semiconductor layers of the web-like region 4 and of the indicator layer 3 may be doped in p-conducting fashion and the semiconductor layers arranged between the active region 21 and the carrier 20 may be doped in n-conducting fashion. In this case, the indicator layer 3 may be embodied as an electron barrier. For a sufficiently high transmissivity for holes, the indicator layer in this case is preferably doped in heavily p-conducting fashion, for example, with magnesium.

The indicator layer 3 serving as a charge carrier barrier may directly adjoin the active region 21.

In a departure from this, the indicator layer 3 may also be embodied in a manner spaced apart from the active region 21. The distance is preferably at most 400 nm, particularly preferably at most 300 nm. The distance may be reduced to a greater extent and be at most 150 nm, preferably at most 120 nm, most preferably at most 70 nm. The closer to the active region 21 the charge carrier barrier 28 is arranged, the greater the extent to which the recombination of charge carriers may be restricted to the active region 21. That proportion of the charge carriers injected into the semiconductor body 2 which recombines in the active region 21 with emission of radiation may thus be increased. As a result, the laser threshold may be lowered and the slope of the characteristic curve of the power of the generated radiation as a function of the injected current (P-I characteristic curve) may be increased.

In a departure from the first exemplary embodiment described with reference to FIG. 1, the top side 31 of the indicator layer 3 may also be spaced apart from the interface 30, wherein the distance between the top side of the indicator layer 3 and the surface 40 is smaller than the distance between the interface 30 and the surface 40. In this case, therefore, the indicator layer 3 projects into the web-like region 4.

More extensively, the indicator layer 3 may also be arranged completely within the web-like region 4. In this case, therefore, the interface 30 is formed outside the indicator layer 3. The distance between the underside 32 of the web-like region 4 and the interface 30 is preferably at most 70 nm, particularly preferably at most 50 nm. The production of such a semiconductor component will be described in connection with FIGS. 5A to 5C.

A second exemplary embodiment of a semiconductor component is illustrated schematically in sectional view in FIG. 2. This second exemplary embodiment substantially corresponds to the first exemplary embodiment described in connection with FIG. 1. In contrast thereto, the cladding layer 24, in particular the web-like region 4, has a partial layer 240, which contains $Al_xIn_yGa_{1-x-y}N$ having an indium content different from zero.

With this partial layer 240, the cladding layer 24 may have lower stress with respect to gallium nitride by comparison with an $Al_xGa_{1-x}N$ cladding layer having the same aluminum content. The stress of the semiconductor body 2 may thus be reduced.

The aluminum content of the partial layer 240 of the cladding layer 24 may be lower than the aluminum content of the indicator layer 3. The production of a web-like region 4 extending as far as the indicator layer 3 is thus simplified.

In a departure therefrom, the aluminum content of the partial layer 240 of the cladding layer 24 may also be higher than the aluminum content of the indicator layer 3. In this case, the material of the web-like region 4 which is arranged directly on that side of the indicator layer 3 which is remote from the active region 21 preferably has a lower aluminum content than the indicator layer 3. The thickness of this material having a lower aluminum content is preferably a thickness of between 20 nm and 400 nm inclusive, particularly preferably between 50 nm and 300 nm inclusive, for example, 150 nm.

In a departure from the exemplary embodiment described, the partial layer 240 may also be arranged on that side of the active region 21 which is remote from the web-like region 4. Furthermore, such a partial layer may also be formed in each case on both sides of the active region. A plurality of such partial layers may also be provided. The stress of the semiconductor body may thus be reduced to a greater extent.

A third exemplary embodiment of a semiconductor component is illustrated in schematic sectional view in FIG. 3. This exemplary embodiment substantially corresponds to the first exemplary embodiment described in connection with FIG. 1. In contrast thereto, the indicator layer 3 is embodied separately from the charge carrier barrier 28, wherein the indicator layer 3 and the charge carrier barrier 28 are arranged on the same side of the active region 21. The waveguide layer 22 is arranged between the charge carrier barrier 28 and the indicator layer 3. The indicator layer 3 is therefore arranged on that side of the waveguide layer 22 which is remote from the active region 21.

In this exemplary embodiment, the indicator layer 3, in particular with regard to the material, may be embodied largely independently of the charge carrier barrier 28. Furthermore, the distance between the web-like region 4 and the active region 21 may be set independently of the position of the charge carrier barrier 28.

A first exemplary embodiment of a method for producing a semiconductor component is shown in FIGS. 4A and 4B on the basis of intermediate steps illustrated schematically in sectional view. In this case, the method is described by way of example on the basis of the production of a semiconductor component embodied in the manner described in connection with FIG. 1.

A semiconductor layer sequence 2 is provided on a carrier 20 (FIG. 4A). Only a part of the semiconductor layer sequence from which a semiconductor body for a semiconductor component emerges is shown, for the sake of simplified illustration. However, a plurality of semiconductor bodies may be formed simultaneously alongside one another.

The semiconductor layer sequence 2 comprises an active region 21, provided for generating radiation, and an indicator layer 3. From a side of the semiconductor layer sequence 2 which is remote from the carrier 20, material of the semiconductor layer sequence is removed in regions by means of a dry-chemical method (FIG. 4B).

By way of example, reactive ion etching, for instance ICP-RIE (inductively coupled plasma RIE) or parallel plate RIE, or chemical assisted ion beam etching is suitable for this purpose. A property of a process gas, for instance of a plasma with portions of the material just removed, is monitored during the dry-chemical removal. In particular, the material composition of the semiconductor material just removed may be determined during removal as a result of the monitoring of the process gas.

When the indicator layer 3 is reached, the monitored property of the process gas changes, such that the reaching of a predetermined removal depth is indicated. The accuracy with which the actual removal depth reaches the predetermined removal depth is therefore largely independent of the actual removal rate.

By way of example, the spectral composition of the radiation emitted by the process gas may be monitored. On the basis of the intensity of the radiation emitted in a spectral range that is characteristic of the material to be removed, the material composition of the material just removed may thus be deduced. By way of example, an increase in the aluminum content in the removed material may be detected as a result of an increase in the radiation power in a spectral range that is characteristic of aluminum.

With regard to the material composition, the indicator layer 3 differs from the semiconductor material disposed upstream as viewed in the removal direction such that the reaching of the indicator layer is manifested in a significant change in the spectral intensity distribution of the process gas.

By way of example, the indicator layer 3 may have an aluminum content that is higher than the aluminum content of the material disposed directly upstream of the indicator layer in the removal direction. In particular, an AlInGaN indicator layer having an aluminum content of at least 30% is suitable. The indicator layer 3 may be embodied, in particular, in a manner free of gallium. By way of example, the indicator layer may have an aluminum content of 82% and an indium content of 18%. Such a semiconductor layer is lattice-matched to a GaN layer.

A selectivity of the removal rate with respect to the aluminum content may be increased, for example, by oxygen being added into the process gas. The higher the aluminum content, the lower the etching rate in this case. What may thus be achieved is that the removal process is almost completely stopped upon reaching the indicator layer 3. Material disposed upstream of the indicator layer may be completely removed largely independently of layer thickness fluctuations in the predetermined regions. Inhomogeneities of the layer thickness and/or of the material composition of the material to be removed along the main extension plane of the semiconductor layers may thus be compensated for in a simple manner. The yield that may be obtained during the production of the semiconductor components may thus be increased.

For externally making electrical contact with the semiconductor component, contact areas may be deposited (not explicitly illustrated in FIG. 4B), for instance by means of vapor deposition or sputtering, on the semiconductor body 2 as described in connection with FIG. 1.

By means of the method described, it is generally possible to form a cutout in a semiconductor layer sequence, the depth of which may be predetermined by way of the position of the indicator layer 3 as early as during the production of the semiconductor layer sequence. In contrast to an etching method in which the etching depth is set by way of the product of expected etching rate and etching duration, in the case of the method described the predetermined removal depth may be achieved even in the case of deviations of the etching rate.

The method has been described merely by way of example on the basis of the production of an edge emitting semiconductor laser component with ridge waveguide geometry, and is generally suitable for the production of semiconductor components in which the removal depth greatly influences the properties of the semiconductor component.

The method described is distinguished, in particular, by the fact that the thickness of the semiconductor material remaining below the removed material after conclusion of the removal is not dependent, or is only slightly dependent, on fluctuations of the layer thickness and/or of the material composition of the material to be removed. In particular, the method may be carried out simultaneously for a plurality of semiconductor layer sequences without production-dictated fluctuations between the different semiconductor layer sequences significantly jeopardizing the yield of functional semiconductor components. Therefore, in one method step, a plurality of semiconductor layer sequences, which, by way of example, are in each case deposited on a wafer, may be simultaneously be subjected to the removal process.

Figure 5B:
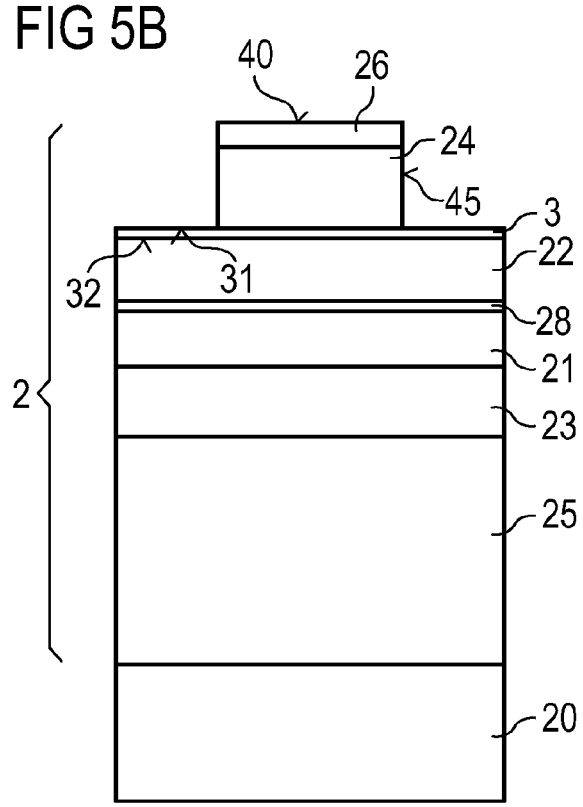

A second exemplary embodiment of a method for producing a semiconductor component is shown in FIGS. 5A to 5C on the basis of intermediate steps illustrated schematically in sectional view. This second exemplary embodiment substantially corresponds to the first exemplary embodiment described in connection with FIGS. 4A and 4B. In contrast thereto, the semiconductor layer sequence of the semiconductor body 2 is embodied in the manner described in connection with FIG. 3. The indicator layer 3 is therefore spaced apart from the active region 21 (FIG. 5A).

As illustrated in FIG. 5B, the indicator layer 3 is uncovered in regions. This may be done in the manner described in connection with FIG. 4B. The material arranged on the indicator layer 3 may thus be removed independently of the actual removal rate to a predetermined distance from the active region 21.

Afterward, the removal method may be continued in a modified manner such that material of the indicator layer 3 is removed with an increased removal rate (FIG. 5C). The increased removal rate may be obtained, for example, by a reduction or a complete setting of the addition of oxygen to the process gas. In this way, the web-like region 4 may be produced such that the indicator layer 3 runs in the web-like region. Furthermore, material of the underlying waveguide layer 22 may also be removed. The interface 30 is formed by means of the waveguide layer 22. In a departure from the exemplary embodiment shown, the interface 30 may also be formed by means of a different layer arranged between the active region 21 and the indicator layer 3, for example, by means of the charge carrier barrier 28.

The invention is not restricted by the descriptions on the basis of the exemplary embodiments. Rather, the invention encompasses any novel feature and also any combination of features, which in particular includes any combination of features in the patent claims, even if this feature or this combination is not explicitly specified in the patent claims or the exemplary embodiments.

The invention claimed is:

1. A semiconductor component, comprising a semiconductor body with a semiconductor layer sequence having an active region, provided for generating coherent radiation, and an indicator layer, wherein the semiconductor body has an interface that delimits the semiconductor body in regions in a vertical direction;
   the semiconductor body has a web-like region on that side of the interface which is remote from the active region, the web-like region extending in a vertical direction between the interface and a surface of the semiconductor body;
   the indicator layer has a material composition that differs from that of a material of the web-like region that adjoins the indicator layer;
   a distance between the indicator layer and the surface is at most of a same magnitude as a distance between the interface and the surface;
   wherein the indicator layer contains $Al_xIn_yGa_{1-x-y}N$ where $0.3 \le x \le 1$, $0 \le y \le 1$ and $x+y \le 1$ and is lattice-matched relative to GaN.

2. The semiconductor component as claimed in claim 1, wherein a distance between the indicator layer and the interface is at most 70 nm.

3. The semiconductor component as claimed in claim 1, wherein the interface is formed by means of the indicator layer.

4. The semiconductor component as claimed in claim 1, wherein a charge carrier barrier is formed on that side of the active region that faces the web-like region and wherein the charge carrier barrier is formed by means of the indicator layer.

5. The semiconductor component as claimed in claim 1, wherein a charge carrier barrier is formed on that side of the active region which faces the web-like region, wherein the indicator layer is spaced apart from the charge carrier barrier.

6. The semiconductor component as claimed in claim 1, wherein a waveguide layer is formed on that side of the active region which faces the web-like region.

7. The semiconductor component as claimed in claim 6, wherein the indicator layer is arranged between the waveguide layer and the active region and wherein the indicator layer has a higher Al content than the material of the web-like region which adjoins the indicator layer.

8. The semiconductor component as claimed in claim 6, wherein the indicator layer is arranged on that side of the waveguide layer which is remote from the active region.

9. The semiconductor component as claimed in claim 1, further comprising a cladding layer with a partial layer arranged at least on one side of the active region and wherein the partial layer contains indium.

10. The semiconductor component as claimed in claim 6, wherein the indicator layer is formed in the waveguide layer.

11. The semiconductor component as claimed in claim 1, wherein the aluminum content of the indicator layer is at least 50%.

* * * * *